United States Patent
Park (10) Patent No.: US 8,432,739 B2
(45) Date of Patent: Apr. 30, 2013

(54) SEMICONDUCTOR INTEGRATED CIRCUIT APPARATUS HAVING CONFIGURATION THAT ENABLES PLANE AREA REDUCTION

(75) Inventor: Jin Su Park, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 197 days.

(21) Appl. No.: 12/962,536

(22) Filed: Dec. 7, 2010

(65) Prior Publication Data

US 2011/0292730 A1    Dec. 1, 2011

(30) Foreign Application Priority Data

May 31, 2010   (KR) .................. 10-2010-0051362

(51) Int. Cl.
*G11C 11/34*   (2006.01)
(52) U.S. Cl.
USPC .................................... 365/185.13
(58) Field of Classification Search ............ 365/185.13
See application file for complete search history.

(56) References Cited

U.S. PATENT DOCUMENTS 5,687,117 A * 11/1997 Chevallier et al. ....... 365/185.12
5,808,500 A    9/1998 Kalpakjian
2003/0043686 A1   3/2003 Lee et al.
2005/0018511 A1   1/2005 Lee
2005/0286285 A1  12/2005 Lee et al.
2006/0120182 A1   6/2006 Lee et al.
2009/0040828 A1 * 2/2009 Ryu et al. ................ 365/185.11
2009/0231928 A1   9/2009 Kim
2009/0244975 A1 * 10/2009 Kang ...................... 365/185.11

FOREIGN PATENT DOCUMENTS

JP   2008-071432   3/2008
JP   2008-084457   4/2008
KR   1020060099142 A   9/2006

* cited by examiner

*Primary Examiner* — Hoai V Ho
*Assistant Examiner* — Pablo Huerta
(74) *Attorney, Agent, or Firm* — William Park & Associates Patent Ltd.

(57) ABSTRACT

Various embodiments of a semiconductor integrated circuit apparatus are disclosed. In one exemplary embodiment, the apparatus may include a memory cell array having a plurality of memory cell blocks, a plurality of word line selection sections corresponding to the plurality of memory cell blocks, a block selection unit configured to provide a driving signal to the plurality of word line selection sections for driving the plurality of memory cell blocks, and a plurality of global line groups, each corresponding to one of the plurality of word line selection sections. Each of the global line groups may include a plurality of signal lines configured to provide a voltage signal to the corresponding word line selection section.

12 Claims, 5 Drawing Sheets

FIG.5 ic Circuit Apparatus Having Configuration That Enables Plane Area Reduction

CROSS-REFERENCES TO RELATED APPLICATION

The present application claims priority under 35 U.S.C. §119(a) to Korean Patent Application No. 10-2010-0051362, filed on May 31, 2010, in the Korean Intellectual Property Office, which is incorporated herein by reference in its entirety as if set forth in full.

BACKGROUND

1. Technical Field

Various embodiments of the present invention relate to a semiconductor integrated circuit apparatus, and more particularly, to a semiconductor integrated circuit apparatus having a configuration that may enable reduction in its plane area.

2. Related Art

In general, a NAND flash memory stores charge in a floating gate using a tunneling phenomenon or performs a programming or erase operation by discharging the charge stored in the floating gate to a channel.

The programming and erase operations are suitable for a non-volatile memory because they satisfy for the required condition for preserving stored data. Since a flash memory has high integration, low power consumption, and high endurance against external impact, it has been extensively used as an auxiliary storage device of a mobile device and various other applications.

The flash memories can be classified into a NAND type flash memory and a NOR type flash memory. Currently, due to consideration of integration density, among other things, the NAND type flash memory is mainly used.

The NAND type flash memory includes a plurality of memory cell blocks having a drain select transistor, a source select transistor, and a cell string connected therebetween. The cell string represents an element in which 16 or 32 MOS transistors are serially connected to one another. Such cell blocks form a group to achieve a memory cell array.

Figure 1:
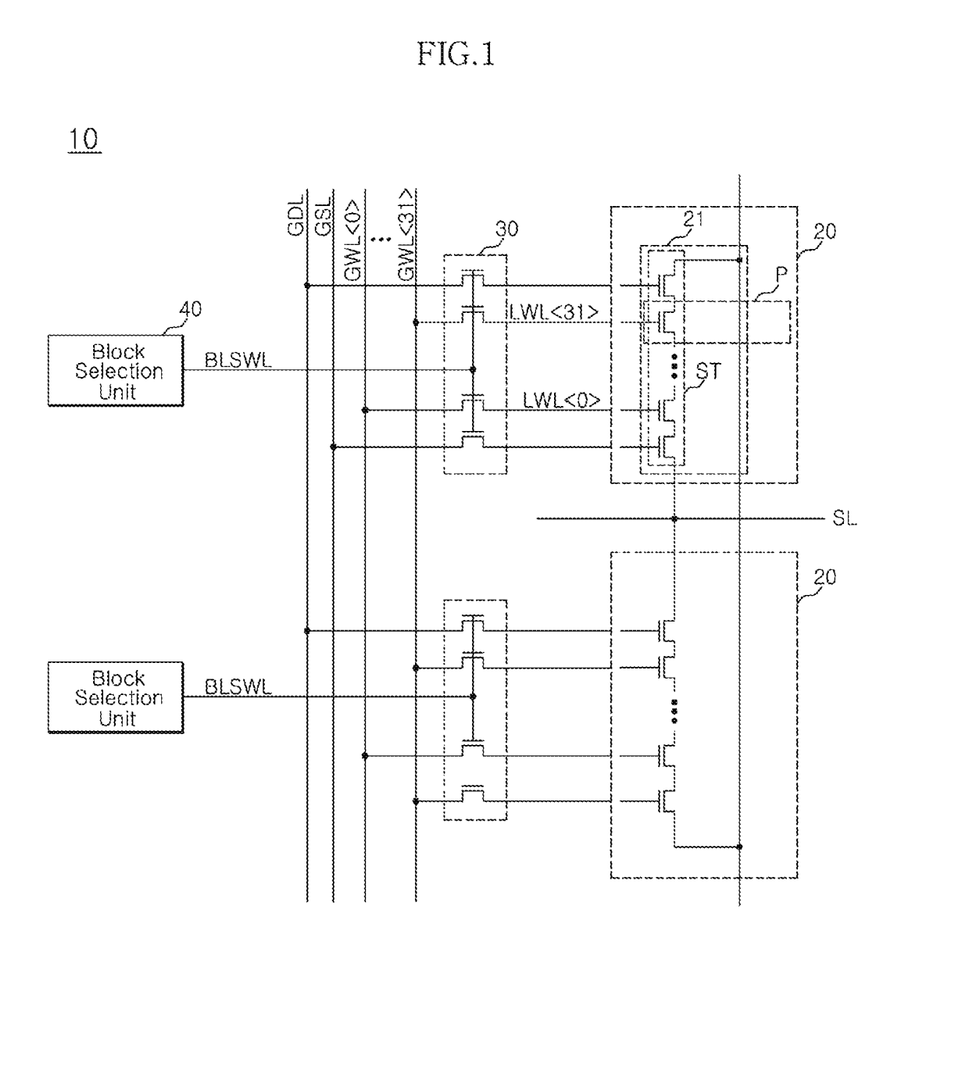
FIG. 1 is a circuit diagram schematically illustrating a conventional flash memory apparatus.

FIG. 1 is a schematic circuit diagram of a conventional flash memory apparatus. The flash memory apparatus 10 may include a plurality of memory cell blocks 20, a plurality of word line selection units 30, and a plurality of block selection units 40. Each memory cell block 20 may be divided into a plurality of cell strings ST and a plurality of pages P.

Each word line selection unit 30 includes a plurality of switching transistors, each of which corresponds to the respective one of the pages P. The switching transistors provide signals of a plurality of global word lines GWL<0:31> to a plurality of local word lines LWL<0:31>, respectively, in response to output signals of the block selection units 40 (i.e., block select word line signals BLSWL for driving the word line selection units 30).

One block selection unit 40 is provided for each memory cell block 20. Each block selection unit 40 generates the block select word line signal BLSWL to drive each word line selection unit 30.

The plurality of global word lines GWL<0:31> are provided between the block selection units 40 and the word line selection units 30. The plurality of global word lines GWL<0:31> are shared by the plurality of word line selection units 30. With such a configuration, a corresponding block selection unit 40 is driven, so that the signals of the plurality of global word lines GWL<0:31> are transmitted to a corresponding memory cell block 20.

However, since the respective switching transistors constituting the word line selection units 30 should switch a high voltage when reading, programming, and erasing the memory cell blocks 20, the switching transistors are fabricated in a relatively wide area. Therefore, it is difficult to reduce the area of the flash memory apparatus.

SUMMARY

Accordingly, there is a need for an improved semiconductor memory apparatus that may enable reduction in its plane area.

To attain the advantages and in accordance with the purposes of the invention, as embodied and broadly described herein, one exemplary aspect of the present invention may provide a semiconductor integrated circuit apparatus. The apparatus may comprise a memory cell array comprising a plurality of memory cell blocks, a plurality of word line selection sections corresponding to the plurality of memory cell blocks, a block selection unit configured to provide a driving signal to the plurality of word line selection sections for driving the plurality of memory cell blocks, and a plurality of global line groups, where each of the plurality of global line groups corresponds to one of the plurality of word line selection sections. In one exemplary embodiment, each of the global line groups comprises a plurality of signal lines configured to provide a voltage signal to the corresponding word line selection section.

According another exemplary aspect, each of the word line selection sections may comprise a drain select switching transistor, a plurality of cell switching transistors, and a source select switching transistor for transmitting voltages of the plurality of signal lines to the memory cell blocks in response to the driving signal.

In still another exemplary aspect, each of the global line groups may comprise a global drain select line, a plurality of global word lines, and a global source line.

In various exemplary aspects, each of the memory cell blocks may comprise a plurality of word lines and a plurality of bit lines, which cross each other. Each of the memory cell blocks may further comprise a drain select transistor, a plurality of cell transistors, and a source select transistor, all of which may be serially connected to each bit line to form a string.

Another exemplary aspect of the present invention may provide a semiconductor integrated circuit apparatus comprising a first memory cell block and a second memory cell block disposed on the same plane as the first memory cell block. The apparatus may also include a first word line selection section corresponding to the first memory cell block, a second word line selection section corresponding to the second memory cell block, a first global line group configured to provide a voltage signal to the first word line selection section, and a second global line group configured to provide a voltage signal to the second word line selection section. The apparatus may further include a block selection unit configured to provide a driving signal to both the first word line selection section and the second word line selection section.

In still another exemplary aspect, each of the first and second memory cell blocks comprises a plurality of word lines and a plurality of bit lines, which cross each other. Each of the first and second memory cell blocks may also comprise a drain select transistor, a plurality of cell transistors, and a source select transistor, all of which are serially connected to each bit line to form a string.

According to yet still another exemplary aspect, each of the first and second word line selection sections may comprise: a drain select switching transistor configured to receive a signal from the corresponding global line group and provide the received signal to a gate of the drain select transistor in response to the driving voltage; a plurality of cell switching transistors configured to be driven in response to the driving voltage and connected to the plurality of cell transistors to provide word line signals to respective gates of the plurality of cell transistors; and a source select switching transistor configured to receive the signal from the corresponding global line group and to provide the received signal to a gate of the source select transistor in response to the driving voltage.

In some exemplary aspects, each of the first and second global line groups comprises: a global drain line configured to be connected to a drain of the drain select switching transistor; a plurality of global word lines configured to be connected to respective drains of the plurality of cell switching transistors; and a global source line configured to be connected to a drain of the source select switching transistor.

The apparatus, according to another exemplary aspect, may further comprise a control switch configured to transmit a ground voltage to respective sources of the drain select switching transistors.

In various exemplary aspects, a semiconductor integrated circuit apparatus may comprise a plurality of memory cell blocks, a plurality of word line selection sections corresponding to the plurality of memory cell blocks, each of the word line selection sections comprising a plurality of switching transistors; a block selection unit configured to provide a driving signal to the plurality of switching transistors; and a plurality of global line groups corresponding to the respective one of the word line selection sections, each of the global line groups comprising a plurality of signal lines for providing a predetermined voltage to the respective switching transistors of the corresponding word line selection section. According to another exemplary aspect, each of the plurality of signal lines may comprise one contact for connection to the corresponding one of the switching transistors when making contact with the word line selection sections.

According to one exemplary aspect, a semiconductor integrated circuit apparatus may comprise a plurality of first memory cell blocks disposed on a first plane and a plurality of second memory cell blocks disposed on a second plane. The apparatus may also include a first word line selection section corresponding to the plurality of first memory cell blocks and disposed on the first plane, where the first word line selection section may comprise a plurality of first switching transistors. The apparatus may also include a second word line selection section corresponding to the plurality of second memory cell blocks and disposed on the second plane, where the second word line selection section may comprise a plurality of second switching transistors. The apparatus may further comprise: a block selection unit configured to provide a driving signal to both the plurality of first switching transistors and the plurality of second switching transistors; a first global line group corresponding to the first word line selection section; and a second global line group corresponding to the second word line selection section. In some exemplary aspects, each of the first and second global line groups may comprise a plurality of signal lines for providing a predetermined voltage to respective one of the first and second switching transistors.

According to another exemplary aspect, the first and second global line groups may be disposed on the first plane and the second plane, respectively.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
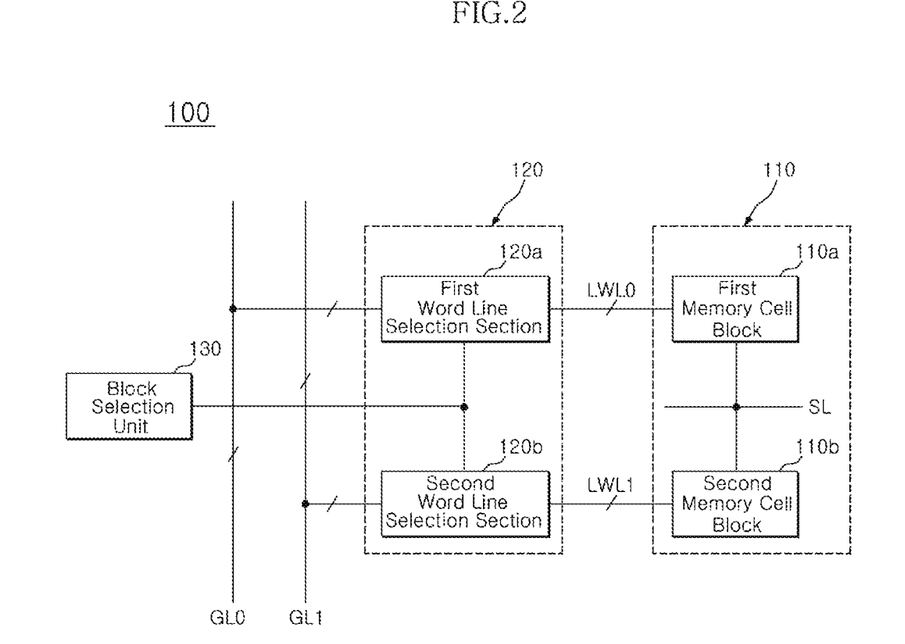
FIG. 2 is a block diagram schematically illustrating a flash memory apparatus in accordance with an exemplary embodiment of the present invention.

FIG. 2 is a partial block diagram of a flash memory apparatus in accordance with an exemplary embodiment of the present invention. Although the diagram shows only two memory cell blocks for illustration purposes, there may be an additional number of memory cell blocks in the flash memory apparatus.

The flash memory apparatus of FIG. 2 may include a memory cell array 110, a word line selection unit 120, and a block selection unit 130.

The memory cell array 110 may include a first memory cell block 110*a* and a second memory cell block 110*b*. The first memory cell block 110*a* and the second memory cell block 110*b* may be located on the same plane, and a source line SL may be provided between the first memory cell block 110*a* and the second memory cell block 110*b*. The first memory cell block 110*a* and the second memory cell block 110*b* may face each other with respect to the source line SL disposed therebetween.

The word line selection unit 120 may include a first word line selection section 120*a* and a second word line selection section 120*b*, corresponding to the first memory cell block 110*a* and the second memory cell block 110*b*, respectively. The first word line selection section 120*a* is configured to select one word line from a plurality of word lines of the first memory cell block 110a. Likewise, the second word line selection section 120b is configured to select one word line from a plurality of word lines of the second memory cell block 110b.

In some exemplary embodiments, the first and second word line selection sections 120a, 120b may include a plurality of switching transistors.

A plurality of global lines may be provided between the block selection unit 130 and the word line selection unit 120. The plurality of global lines may be categorized into a first global line group GL0 and a second global line group GL1. The first global line group GL0 is electrically connected to the first word line selection section 120a, while the second global line group GL1 is electrically connected to the second word line selection section 120b.

The block selection unit 130 may be shared by the first and second word line selection sections 120a, 120b to control their operations. The block selection unit 130 may be configured to generate a block select word line signal BLSWL and provide the block select word line signal BLSWL to each of the first word line selection section 120a and the second word line selection section 120b.

The block selection unit 130 may be a circuit block that occupies the second largest plane area in a flash memory apparatus, next to the word line selection sections 120a, 120b. By configuring the block selection unit 130 to be shared by a plurality of word line selection sections 120a, 120b, a flash memory apparatus may include a reduced number of block selection units 130, resulting in a reduction of the entire plane area of the flash memory apparatus.

While the block selection unit 130 is shared by the plurality of word line selection sections 120a, 120b, the flash memory apparatus may include the same number of global line groups GL0, GL1 corresponding to the number of the word line selection sections 120a, 120b.

In general, the word line selection sections 120a, 120b are known to occupy a significantly large area because they are to perform a high voltage switching. For this reason, when designing a flash memory apparatus, a predetermined area is set aside for the word line selection sections 120a and 120b to ensure the performance of the word line selection sections 120a and 120b. Thus, the current flash memory apparatus may have a sufficient space between the block selection unit 130 and the word line selection sections 120a, 120b. Consequently, even if the number of global line groups GL0, GL1 having a plurality of global lines is increased, such an increase may not require an additional area.

Figure 3:
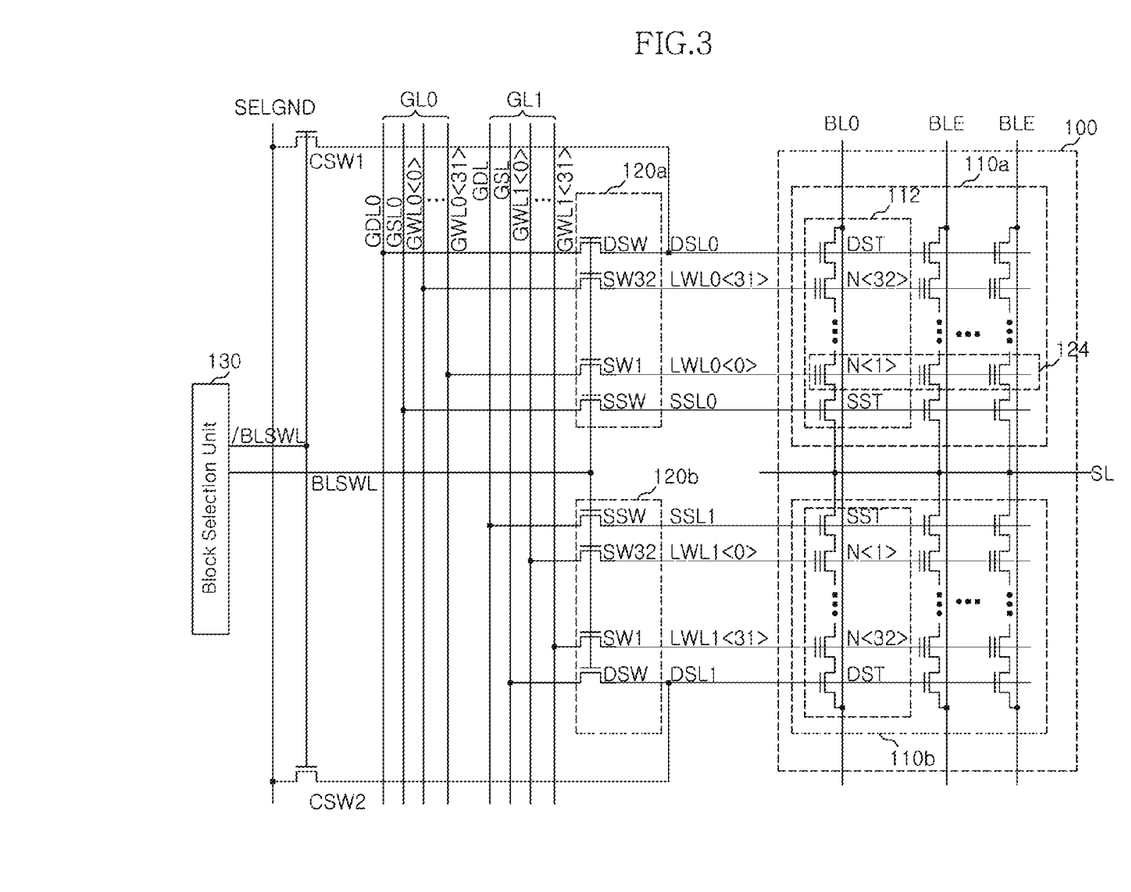
FIG. 3 is a detailed circuit diagram of the flash memory apparatus illustrated in FIG. 2.

FIG. 3 is a detailed circuit diagram of the flash memory apparatus illustrated in FIG. 2.

Referring to FIG. 3, each of the first and second memory cell blocks 110a and 110b may include a plurality of word lines LWL0<0:31>, LWL1<0:31> and a plurality of bit lines BLO, BLE, which cross each other. The plurality of bit lines may be classified as a plurality of odd bit lines BLO and a plurality of even bit lines BLE, which are alternately disposed next to one another. A plurality of cell strings 112, each of which may comprise a plurality of serially connected MOS transistors, may be connected to each of the bit lines BLO, BLE.

According to one exemplary embodiment, each cell string 112 may comprise a drain select transistor DST, a plurality of cell transistors N<1:32>, and a source select transistor SST, which may be serially connected to one another. A group of transistors connected to one word line is generally referred to as a page. Accordingly, each of the memory cell blocks 110a, 110b includes a plurality of cell strings 112 and a plurality of pages 124.

The first memory cell block 110a and the second memory cell block 11b may have the same configuration and may be symmetrically arranged with respect to the source line SL located therebetween. The sources of the source select transistors SST of the first memory cell block 110a and the second memory cell block 110b may be electrically connected to the source line SL, as shown in FIG. 3.

The first word line selection section 120a may include a drain select switching transistor DSW, a plurality of cell switching transistors <SW1:SW32>, and a source select switching transistor SSW.

Each of the global line groups GL0 and GL1 may comprise a global drain select line GDL0, GDL1, a plurality of global word lines GWL0<0:31>, GWL1<0:31>, and a global source select line GSL0, GSL1.

The drain select switching transistor DSW of the first word line selection section 120a may be electrically connected to the global drain select line GDL0 of the first global line group GL0 and a first drain select line DSL0 of the first memory cell block 110a, and be driven in response to the block select word line signal BLSWL.

The plurality of cell switching transistors <SW1:SW32> of the first word line selection section 120a may be connected between the respective global word lines GWL0<0:31> of the first global line group GL0 and the respective local word lines LWL0<0:31>, and be driven in response to the block select word line signal BLSWL.

The source select switching transistor SSW of the first word line selection section 120a may be connected between the source select line GSL0 of the first global line group GL0 and a first source select line SSL, and be driven in response to the block select word line signal BLSWL.

The second word line selection section 120b may have the same configuration as that of the first word line selection section 120a. For example, the second word line selection section 120b may be connected to a second global drain select line GDL1, a plurality of second global word lines GWL1<0:31>, and a second global source select line GSL1 of the second global line group GL1.

The flash memory apparatus, consistent with certain embodiments of the present invention, may further comprise control switches CSW1, CSW2 configured to provide a ground voltage to the source of the drain select switching transistor DSW (e.g., the gate of the source select transistor SST) in order to selectively control the driving of the memory cell blocks 110a, 110b. Control switches CSW1 and CSW2 are configured to selectively provide the ground voltage of a cell ground line SELGND to drain select lines DSL0 and DSL1, respectively, in response to an inverted block select word line signal /BLSWL of the block selection unit 130.

As described above, the block selection unit 130 is configured to be shared by the first word line selection section 120a and the second word line selection section 120b. Thus, the block selection unit 130 is configured to generate the block select word line signal BLSWL and provide the generated block select word line signal BLSWL to all of the gates of the cell switching transistors <SW1:SW32> of the first and second word line selection sections 120a, 120b.

Figure 4:
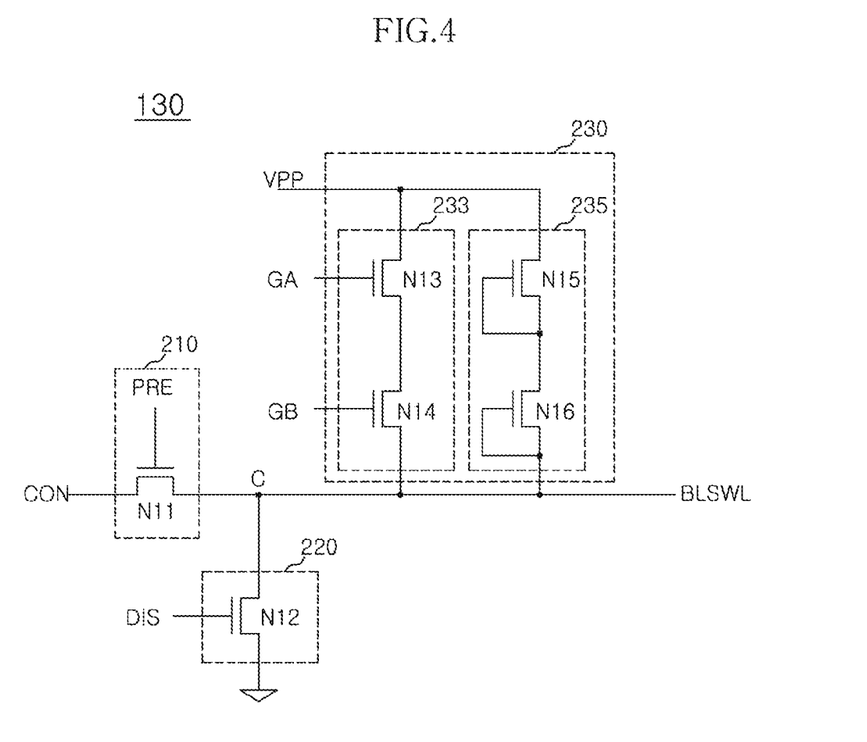
FIG. 4 is an internal circuit diagram of a block selection unit in accordance with one exemplary embodiment of the present invention.

FIG. 4 shows an internal circuit diagram of an exemplary block selection unit 130, consistent with various embodiments of the present invention. As shown in the diagram, the block selection unit 130 may include a control section 210, a discharge section 220, and a precharge section 230.

The control section 210 may include a NMOS transistor N11 configured to transmit a control signal CON to node C in response to a precharge signal PRE. The control signal CON may be obtained by combining program precharge signals and address signals.

The discharge section 220 may include a NMOS transistor N12 configured to discharge the voltage of node C in response to a discharge signal DIS.

The precharge section 230 may include a switching part 233 and a clamping part 235. The switching part 233 may include a pair of NMOS transistors N13, N14 that are serially connected between a high voltage terminal VPP and node C. NMOS transistors N13 and N14 are configured to be turned on in response to first and second address coding signals GA and GB, respectively. When NMOS transistors N13 and N14 are turned on, node C is precharged to a high voltage level VPP.

The clamping part 235 may include a pair of diode-type NMOS transistors N15 and N16 that are serially connected between the high voltage terminal VPP and node C. The term "diode-type NMOS transistor," as used herein, refers to a transistor that has its gate and source connected to each other, as is well known to those skilled in the art.

When the voltage of node C (i.e, the voltage of the block select word line signal BLSWL) rises above a preset level, the clamping part 235 clamps the voltage to maintain the voltage level of the block select word line signal BLSWL at the preset level.

In a semiconductor memory apparatus having the above-described configuration, since the block selection unit 130 is shared by the first and second word line selection sections 120a, 120b, the block select word line signal BLSWL (i.e., the output signal of the block selection unit 130) can be simultaneously provided to the switching transistors DSW, <SW1:SW32>, SSW of the first and is second word line selection sections 120a, 120b.

When the block select word line signal BLSWL is activated to a high level, even if switching transistors DSW, <SW1:SW32> and SSW are simultaneously turned on, the word lines can be individually controlled according to their respective memory blocks because the word line selection sections 120a, 120b are separately connected to different global line groups GL0, GL1.

For example, when a specific word line LWL0<n> located at a specific position of the first memory cell block 110a is desired to be selected, although the block select word line signal BLSWL is provided to both the first word line selection section 120a and the second word line selection section 120b, a predetermined voltage can be selectively applied only to the desired word line LWL0<n> by voltages individually applied to the respective global word lines.

Conventionally, each word line selection section's switching transistors having the same function are required to contact a corresponding global line. As a result, a plurality of contacts are provided in one global line, which causes a problem of increased junction capacitance.

However, various exemplary embodiments of the present invention may provide global line groups GL0 and GL1 that correspond to their respective word line selection sections 120a, 120b. Thus, the global word lines (or global drain or source lines) are connected only to the switching transistors of the corresponding word line selection section, eliminating the need for a plurality of contacts and resulting in reduction of junction capacitance.

Table 1 below shows exemplary voltage conditions for read, program and erase operations of a semiconductor memory apparatus, consistent with various exemplary embodiments of the invention.

TABLE 1

| Memory cell block | Read | | Program | | Erase | |
|---|---|---|---|---|---|---|
| | Selection | Non-selection | Selection | Non-selection | Selection | Non-selection |
| GDL | 4.5 V | 0 V | VCC | 0 V | 4.5 V | 4.5 V |
| GSL | 4.5 V | 0 V | 0 V | 0 V | 4.5 V | 4.5 V |
| GWL<0:31> | Vread/Vpass | 0 V | Vpgm/Vpass | 0 V | 0 V | |
| BLSWL | VPP | | VPP | | VCC | |
| DSL | 4.5 V | 0 V | VCC | 0 V | F | F |
| SSL | 4.5 V | 0 V | 0 v | 0 V | F | F |
| LWL<0:31> | Vread/Vpass | 0 V | Vpgm/Vpass | 0 V | 0 V | F |

As shown in Table 1, when reading a memory cell, a predetermined voltage (e.g., 4.5 V) is provided to the global drain select lines GDL and the global source select lines GSL of the respective memory cell blocks 110a and 110b. A read voltage Vread is then provided to certain global word lines selected from a plurality of global word lines GWL<0:31> of global line group GL0 or GL1 (which corresponds to a selected memory cell block). A pass voltage Vpass is provided to the other global word lines. At the same time, a high voltage VPP is provided through the block select word line signal BLSWL.

Thus, even if the block select word line signal BLSWL is provided to all of the word line selection sections, a memory cell block that did not receive the read voltage cannot be selected because the read voltage Vread is selectively provided.

To perform a read operation for the selected memory cell block, the switching transistors DSW, <SW1:SW32>, SSW are turned on by the block select word line signal BLSWL, and the drain select line DSL, the source select line SSL, and the local word line LWL<0:31> are provided with 4.5 V, 4.5 V, and the read voltage Vread or the pass voltage Vpass, respectively.

When programming a memory cell, a driving voltage VCC is provided to the global drain select lines GDL of the respective memory cell blocks 110a and 110b, and 0 V is provided to the global source select lines GSL of the respective memory cell blocks 110a and 110b. Furthermore, the high voltage VPP is provided through the block select word line signal BLSWL, while a program voltage Vpgm is applied to one of the plurality of global word lines GWL<0:31> of a global line group connected to a memory block to be selected, and the pass voltage Vpass is applied to the other global word lines. Thus, even if the block select word line signal BLSWL is provided to all of the word line selection sections 120a and 120b, the memory cell block 110a or 110b that did not receive the program voltage Vpgm cannot be actually selected since the program voltage Vpgm is selectively provided.

To perform a program operation in the selected memory cell block, the switching transistors DSW, <SW1:SW32>, and SSW are turned on by the block select word line signal BLSWL, and the driving voltage VCC, 0 V, and the program voltage Vpgm or the pass voltage Vpass are applied to the drain select line DSL, the source select line SSL, and the local word line LWL<0:31>, respectively.

When erasing a memory cell, 4.5 V is applied to the global drain select lines GDL and the global source select lines GSL of the respective memory cell blocks 110a and 110b. The global word lines GWL<0:31> of the memory cell block to be selected 110a or 110b are then provided with 0 V, so that simultaneous erasure can be performed. Further, the global word lines GWL<0:31> of the memory cell block not to be selected 110b or 110a are provided with 4.5 V. At these voltage conditions, the driving voltage VCC is provided through the block select word line signal BLSWL.

With respect to the memory cell block to be selected, because the drain and source switching transistors DSW and SSW are not turned on, the drain and source select lines DSL and SSL are maintained in a floating state. Further, the operation of the cell switching transistors <SW1:SW31> provides 0 V to the word lines LWL<0:31>, so that an erase operation is performed for the entire block. In the meantime, no erase operation is performed in the non-selected memory block 110b or 110a since all of its switching transistors DSW, SSW and <SW1:SW32> are not driven, which renders the drain select line DSL, the source select line SSL, and the local word line LWL<0:31> of the memory cell to be in a floating state.

In accordance with the various exemplary embodiment described above, the word line selection sections 120a and 120b may share one block selection unit 130, and the global line groups GL0 and GL1 are provided corresponding to the word line selection sections 120a and 120b. Consequently, the number of the block selection units 130, which typically occupies the second largest area, next to the word line selection sections 120a and 120b, can be reduced, resulting in an improvement of layout efficiency.

While additional number of global line groups having multiple lines may be needed to reduce the number of block selection units 130, an additional area for the global lines is not required because a spare area for the word line selection sections 120a and 120b can be used to accommodate the global line groups GL0 and GL1.

In addition, the global lines are arranged corresponding to the word line selection sections 120a and 120b, so that the number of contacts provided in one global line can be reduced. Consequently, junction capacitance due to contacts and disturbance among adjacent contacts can be prevented.

While certain embodiments have been described above, it will be understood to those skilled in the art that the embodiments described are by way of example only. Accordingly, a semiconductor integrated circuit apparatus described herein should not be limited based on the described embodiments. Rather, the semiconductor integrated circuit apparatus described herein should only be limited in light of the claims that follow when taken in conjunction with the above description and accompanying drawings.

For example, in the exemplary embodiment described above, the word line selection sections 120a and 120b share one block selection unit 130. It should be understood, however, that more than two word line selection sections may share one block selection unit. For example, as illustrated in FIG. 5, four word line selection sections 120a to 120d may share one block selection unit 130.

Figure 5:
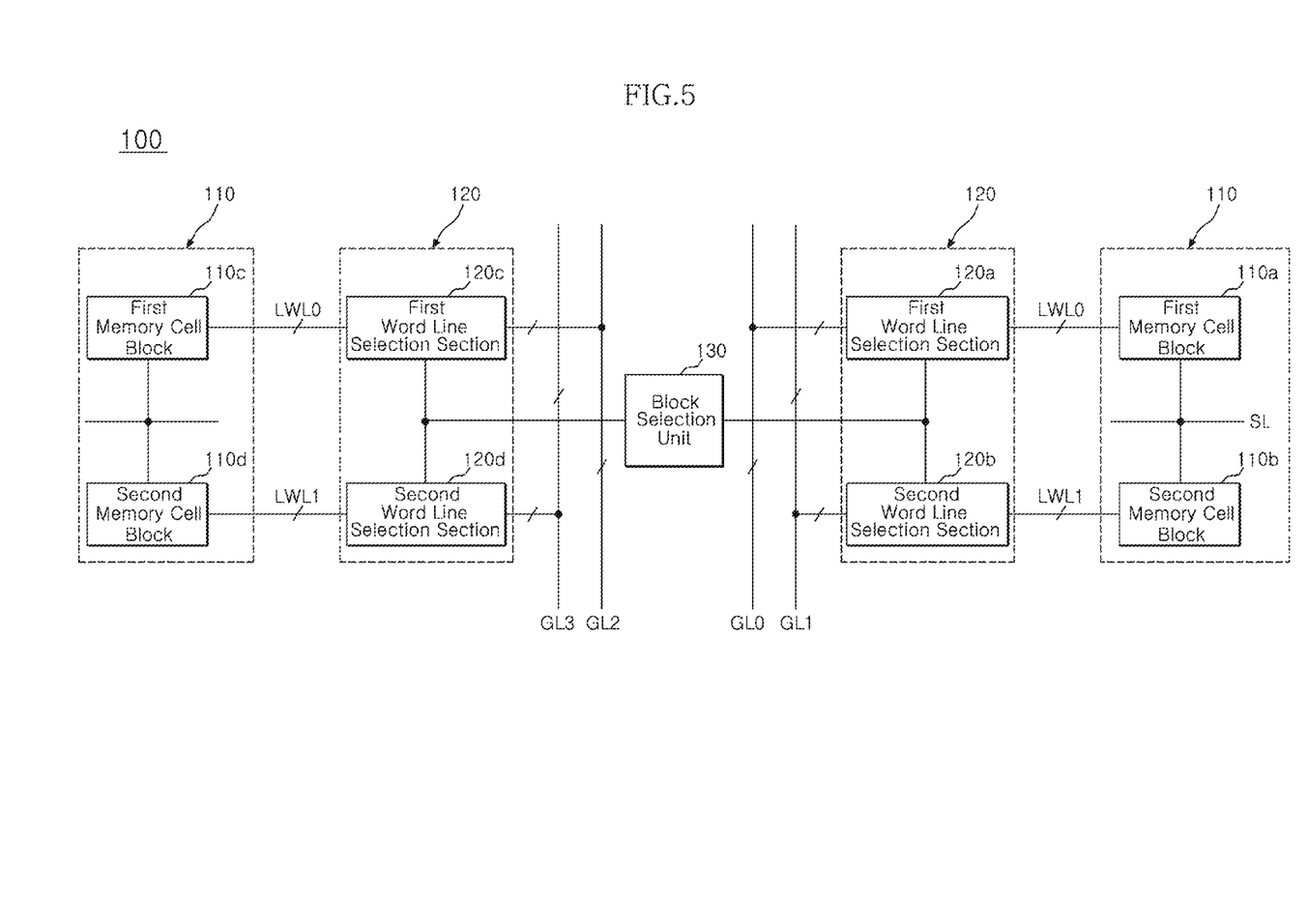
FIG. 5 is a schematic block diagram of a flash memory apparatus in accordance with another exemplary embodiment of the present invention.

As illustrated in FIG. 5, even if one block selection unit 130 is shared by the four word line selection sections 120a to 120d, since global line groups are provided corresponding to the four word line selection sections 120a to 120d, it is possible to perform an individual operation by one block select word line signal in the manner consistent with the above-described embodiments.

A memory cell array 110, a word line selection section 120 and global line groups GL2 and GL3, which are located at the left side of the block selection unit 130, and a memory cell array 110, a word line selection section 120 and global line groups GL0 and GL1, which are located at the right side of the block selection unit 130, may be located on planes different from each other, and the block selection unit 130 may be located on one of the planes.

Throughout the description, including in the claims, the term "comprising a" should be understood as being synonymous with the term "comprising at least one" unless otherwise specified to the contrary.

What is claimed is:

1. A semiconductor integrated circuit apparatus comprising:
   a memory cell array comprising a plurality of memory cell blocks;
   a plurality of word line selection sections corresponding to the plurality of memory cell blocks;
   a block selection unit configured to provide a driving signal to the plurality of word line selection sections for driving the plurality of memory cell blocks; and
   a plurality of global line groups, each corresponding to one of the plurality of word line selection sections, each of the global line groups comprising a plurality of signal lines configured to provide a voltage signal to the corresponding word line selection section,
   wherein the plurality of global line groups includes a plurality of global word lines, respectively, and the plurality of word line selection sections are configured to share the block selection unit.

2. The semiconductor integrated circuit apparatus according to claim 1, wherein each of the word line selection sections comprises a drain select switching transistor, a plurality of cell switching transistors, and a source select switching transistor for transmitting voltages of the plurality of signal lines to the memory cell blocks in response to the driving signal,
   wherein one of the plurality of the cell switching transistors is connected with only one of the plurality of the global word lines.

3. The semiconductor integrated circuit apparatus according to claim 2, wherein each of the global line groups further comprises a global drain select line, and a global source line.

4. The semiconductor integrated circuit apparatus according to claim 2, wherein each of the memory cell blocks comprises a plurality of word lines and a plurality of bit lines, which cross each other, and a drain select transistor, a plurality of cell transistors and a source select transistor are serially connected to each bit line to form a string.

5. A semiconductor integrated circuit apparatus comprising:
   a first memory cell block;
   a second memory cell block disposed on the same plane as the first memory cell block;
   a first word line selection section corresponding to the first memory cell block;
   a second word line selection section corresponding to the second memory cell block;
   a first global line group comprising a plurality of global word lines and configured to provide a voltage signal to the first word line selection section;
   a second global line group comprising a plurality of global word lines and configured to provide a voltage signal to the second word line selection section; and
   a block selection unit configured to provide a driving signal to both the first word line selection section and the second word line selection section, wherein the first word line selection section and the second word line selection section are configured to share the block selection unit.

6. The semiconductor integrated circuit apparatus according to claim 5, wherein each of the first and second memory cell blocks comprises a plurality of word lines and a plurality of bit lines, which cross each other, and a drain select transistor, a plurality of cell transistors, and a source select transistor, all of which are serially connected to each bit line to form a string.

7. The semiconductor integrated circuit apparatus according to claim 6, wherein each of the first and second word line selection sections comprises:
 a drain select switching transistor configured to receive a signal from the corresponding global line group and provide the received signal to a gate of the drain select transistor in response to the driving voltage;
 a plurality of cell switching transistors configured to be driven in response to the driving voltage and connected to the plurality of cell transistors to provide word line signals to respective gates of the plurality of cell transistors; and
 a source select switching transistor configured to receive the signal from the corresponding global line group and to provide the received signal to a gate of the source select transistor in response to the driving voltage.

8. The semiconductor integrated circuit apparatus according to claim 7, wherein each of the first and second global line groups further comprises:
 a global drain line configured to be connected to a drain of the drain select switching transistor;
 a global source line configured to be connected to a drain of the source select switching transistor, wherein the plurality of global word lines are configured to be connected to respective drains of the plurality of cell switching transistors.

9. The semiconductor integrated circuit apparatus according to claim 7, further comprising a control switch configured to transmit a ground voltage to respective sources of the drain select switching transistors.

10. A semiconductor integrated circuit apparatus comprising:
 a plurality of memory cell blocks;
 a plurality of word line selection sections corresponding to the plurality of memory cell blocks, each of the word line selection sections comprising a plurality of switching transistors;
 a block selection unit configured to provide a driving signal to the plurality of switching transistors, wherein at least two word line selection sections are configured to share the block selection unit; and
 a plurality of global line groups corresponding to the respective one of the word line selections sections, each of the global line groups comprising a plurality of global word lines for providing a predetermined voltage to the respective switching transistors of the corresponding word line selection section,
wherein one of the global word lines are connected by one of the switching transistor by one contact area.

11. A semiconductor integrated circuit apparatus comprising:
 a plurality of first memory cell blocks disposed on a first plane;
 a plurality of second memory cell blocks disposed on a second plane;
 a first word line selection section corresponding to the plurality of first memory cell blocks and disposed on the first plane, the first word line selection section comprising a plurality of first switching transistors;
 a second word line selection section corresponding to the plurality of second memory cell blocks and disposed on the second plane, the second word line selection section comprising a plurality of second switching transistors;
 a block selection unit configured to provide a driving signal to both the plurality of first switching transistors and the plurality of second switching transistors;
 a first global line group corresponding to the first word line selection section; and
 a second global line group corresponding to the second word line selection section,
wherein each of the first and second global line groups comprises a plurality of signal lines for providing a predetermined voltage to respective one of the first and second switching transistors and the first word line selection section and the second word line selection section are configured to share the block selection unit.

12. The semiconductor integrated circuit apparatus according to claim 11, wherein the first and second global line groups are disposed on the first plane and the second plane, respectively.

* * * * *